United States Patent
Imamura (10) Patent No.: US 12,417,915 B2
(45) Date of Patent: Sep. 16, 2025

(54) LASER IRRADIATION APPARATUS, LASER IRRADIATION METHOD, AND METHOD FOR MANUFACTURING SEMICONDUCTOR DEVICE

(71) Applicant: JSW AKTINA SYSTEM CO., LTD., Yokohama (JP)

(72) Inventor: Hiroaki Imamura, Tokyo (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 692 days.

(21) Appl. No.: 17/495,380

(22) Filed: Oct. 6, 2021

(65) Prior Publication Data

US 2022/0122844 A1    Apr. 21, 2022

(30) Foreign Application Priority Data

Oct. 15, 2020 (JP) ................... 2020-173773

(51) Int. Cl.
*H01L 21/02* (2006.01)
*B23K 26/06* (2014.01)
(Continued)

(52) U.S. Cl.
CPC .... *H01L 21/02678* (2013.01); *B23K 26/0643* (2013.01); *B23K 26/0648* (2013.01);
(Continued)

(58) Field of Classification Search
CPC ................................................ H01L 21/02678
See application file for complete search history.

(56) References Cited

U.S. PATENT DOCUMENTS 5,357,365 A * 10/1994 Ipposhi ............... B23K 26/064
359/205.1
6,790,425 B1 * 9/2004 Smalley ................. B82Y 30/00
423/447.2
(Continued)

FOREIGN PATENT DOCUMENTS

CN    104245220 A    12/2014
CN    105206517 A    12/2015
(Continued)

OTHER PUBLICATIONS

Office Action issued Jun. 4, 2024 in Japanese Application No. 2020-173773.
(Continued)

*Primary Examiner* — William A Harriston
(74) *Attorney, Agent, or Firm* — Sughrue Mion, PLLC (57) ABSTRACT

A laser irradiation apparatus including: a laser light source configured to emit a linearly polarized pulsed laser light; a first half-wave plate rotatably provided in an optical path of the pulsed laser light; a first polarization beam splitter configured to branch the pulsed laser light from the first half-wave plate into a first pulsed light and a second pulsed light; a second polarization beam splitter configured to combined the first pulsed light with the second pulsed light, the second pulsed light, the second pulsed light being delayed from the first pulsed light by using an optical path length difference between the first pulsed light and the second pulsed light; and a first wave plate rotatably provided in an optical path of a combined pulsed light generated by combining the first pulsed light with the second pulsed light at the second polarization beam splitter.

14 Claims, 8 Drawing Sheets

(51) Int. Cl.
  *B23K 26/073* (2006.01)
  *B23K 101/40* (2006.01)
  *H01L 21/66* (2006.01)
(52) U.S. Cl.
  CPC ............ *B23K 26/073* (2013.01); *H01L 22/12* (2013.01); *B23K 2101/40* (2018.08)

(56) References Cited

U.S. PATENT DOCUMENTS

| | | | |
|---|---|---|---|
| 8,110,775 B2* | 2/2012 | Lo ....................... | H01L 23/5258 219/121.68 |
| 9,460,922 B1* | 10/2016 | Ahn ....................... | H01L 21/268 |
| 2004/0074881 A1* | 4/2004 | Oishi ................... | B23K 26/082 219/121.64 |
| 2005/0070035 A1* | 3/2005 | Yazaki ................... | H10D 86/60 438/22 |
| 2005/0199596 A1* | 9/2005 | Takami ................... | H01L 22/26 219/121.65 |
| 2009/0238223 A1* | 9/2009 | Kawakami ......... | B23K 26/0608 372/27 |
| 2010/0320401 A1* | 12/2010 | Tsukihara ......... | H01L 21/02678 257/E21.328 |
| 2013/0196464 A1 | 8/2013 | Viatella et al. | |
| 2014/0076863 A1 | 3/2014 | Moffitt | |
| 2015/0231735 A1 | 8/2015 | Moffitt | |
| 2019/0267240 A1* | 8/2019 | Ohmori ............. | H01L 21/02691 |
| 2020/0343090 A1* | 10/2020 | Kobayashi ......... | H10D 30/0321 |
| 2021/0020443 A1* | 1/2021 | Imamura ............ | G01N 21/8422 |
| 2022/0184734 A1* | 6/2022 | Ohmori ................ | B23K 26/067 |

FOREIGN PATENT DOCUMENTS

| | | |
|---|---|---|
| CN | 105710530 A | 6/2016 |
| JP | 2007-59431 A | 3/2007 |
| JP | 2009-31634 A | 2/2009 |
| JP | 2015-507365 A | 3/2015 |
| JP | 2017-224708 A | 12/2017 |
| JP | 6706155 B2 | 6/2020 |
| WO | 2013/115857 A2 | 8/2013 |

OTHER PUBLICATIONS

The Patent ffice of the People's Republic of China, Notification of First Office Action issued in CN Appln 202111199213.8 dated Jun. 3, 2025, with English translation.

* cited by examiner

Fig. 8

LASER IRRADIATION APPARATUS, LASER IRRADIATION METHOD, AND METHOD FOR MANUFACTURING SEMICONDUCTOR DEVICE

INCORPORATION BY REFERENCE

This application is based upon and claims the benefit of priority from Japanese patent application No. 2020-173773, filed on Oct. 15, 2020, the disclosure of which is incorporated herein in its entirety by reference.

BACKGROUND

The present disclosure relates to a laser irradiation apparatus, a laser irradiation method, and a method for manufacturing a semiconductor device.

Japanese Patent No. 6706155 discloses a laser annealing apparatus for forming a poly-crystalline silicon thin film. In Japanese Patent No. 6706155, a solid-state laser apparatus emits linear polarization laser light. The linear polarized laser beam is incident on a polarization beam splitter through a half-wave plate. The polarization beam splitter splits the laser light into two light beams. The two light beams split by the polarization beam splitter are combined with each other at the second polarization beam splitter.

SUMMARY

In such a laser irradiation apparatus, it is desired to irradiate the laser light having an appropriate polarization state with an object.

Other problems and novel features will be clarified from the description of this specification and the attached drawings.

According to an embodiment, a laser irradiation apparatus including: a laser light source configured to emit a linearly polarized pulsed laser light; a first half-wave plate rotatably provided in an optical path of the pulsed laser light; a first polarization beam splitter configured to branch the pulsed laser light from the first half-wave plate into a first pulsed light and a second pulsed light; a second polarization beam splitter configured to combined the first pulsed light with the second pulsed light, the second pulsed light being delayed from the first pulsed light by using an optical path length difference between the first pulsed light and the second pulsed light; and a first wave plate rotatably provided in an optical path of a combined pulsed light generated by combining the first pulsed light with the second pulsed light at the second polarization beam splitter.

According to an embodiment, a laser irradiation method including: (a) emitting a linearly polarized pulsed laser light; (b) causing the pulsed laser light to be made incident on a first half-wave plate rotatably placed; (c) branching the pulsed laser light from the first half-wave plate into a first pulsed light and a second pulsed light; (d) combining the first pulsed light with the second pulsed light, the second pulsed light being delayed from the first pulsed light by using an optical path length difference between the first pulsed light and second pulsed light; (e) causing a combined pulsed laser to be made incident on a first wave plate rotatably provided in an optical path of the combined pulsed laser, the combine pulsed laser being generated by combining the first pulsed light with the second pulsed light at the second polarization beam splitter.

According to an embodiment, A method for manufacturing a semiconductor device, including the steps of: (S1) forming an amorphous film over a substrate; and (S2) annealing the amorphous film so that the amorphous film is crystalized and a crystallized film is thereby formed, wherein the (S2) annealing comprises the steps of: (A) emitting a linearly polarized pulsed laser light;
(B) causing the pulsed laser light to be made incident on a first half-wave plate rotatably placed;
(C) branching the pulsed laser light from the first half-wave plate into a first pulsed light and a second pulsed light; (D) combining the first pulsed light with the second pulsed light, the second pulsed light being delayed from the first pulsed light by using an optical path length difference between the first pulsed light and second pulsed light; (E) causing a combined pulsed laser to be made incident on a first wave plate rotatably provided in an optical path of the combined pulsed laser, the combine pulsed laser being generated by combining the first pulsed light with the second pulsed light at the second polarization beam splitter.

According to the embodiment, it is possible to irradiate the laser light having an appropriate polarization state with an object.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

A laser irradiation apparatus according to this embodiment is, for example, a laser annealing apparatus that forms an LTPS (Low Temperature Poly-Silicon) film. A laser irradiation g apparatus, a laser annealing method, and a method for manufacturing a semiconductor device according to this embodiment will be described hereinafter with reference to the drawings.

(Optical System of a Laser Irradiation Apparatus)

Figure 1:
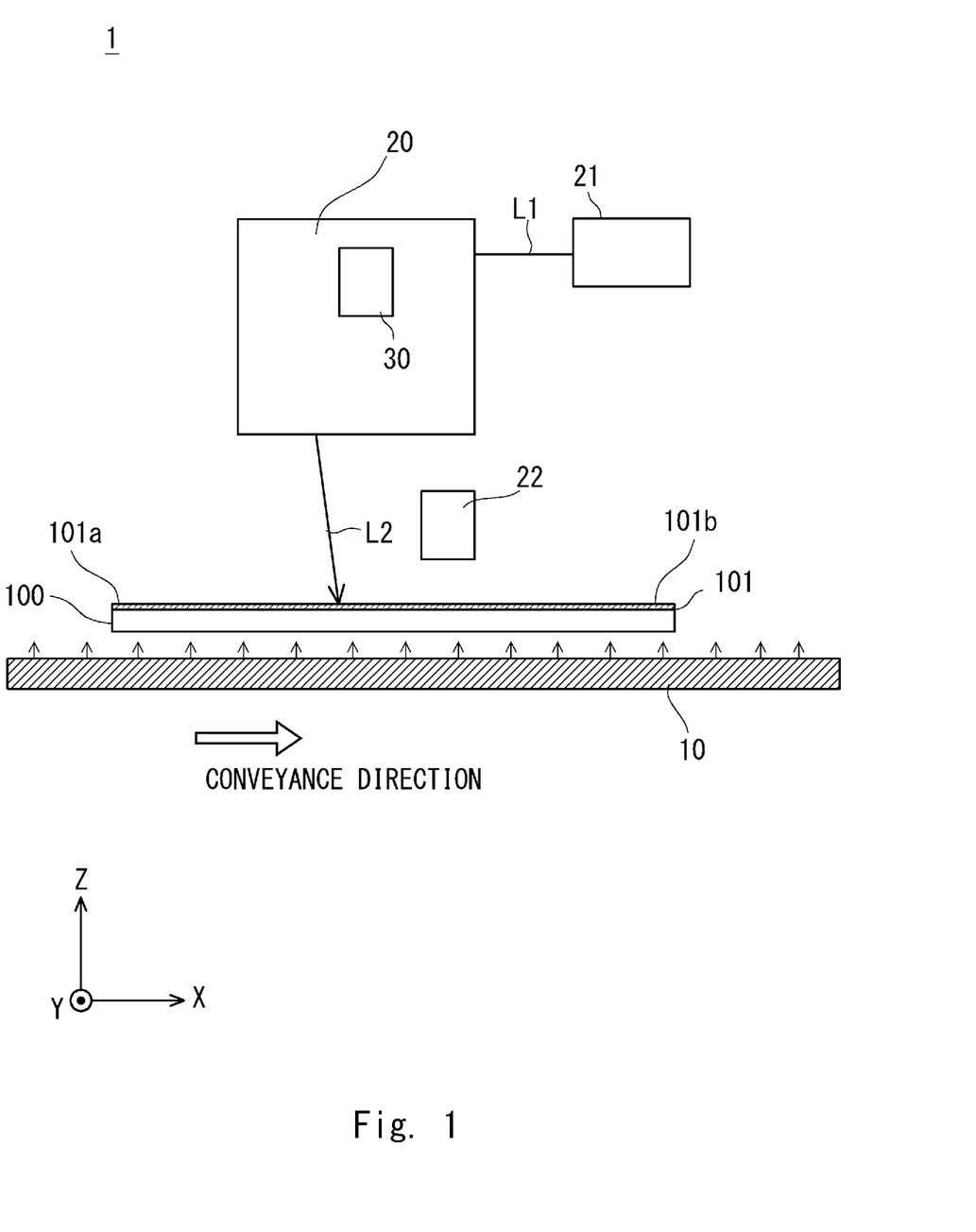
FIG. 1 shows an optical system of a laser annealing apparatus according to the present embodiment.

A configuration of a laser irradiation apparatus according to the present embodiment will be described with reference to FIG. 1. FIG. 1 schematically shows an optical system of the laser irradiation apparatus 1. A silicon film 101 is formed over the upper surface (the main surface) of a substrate 100. The laser irradiation apparatus 1 irradiates the silicon film 101 formed over the substrate 100 with laser light L1. In this way, it is possible to convert an amorphous silicon film (a-Si film) 101 into a poly-crystalline silicon film (polysilicon film: p-Si film) 101. The substrate 100 is, for example, a transparent substrate such as a glass substrate. The substrate 100 is an object to be irradiated with the laser beam.

Note that, an XYZ three-dimensional orthogonal coordinate system is shown in FIG. 1 to clarify the description. The Z-direction is the vertical direction and perpendicular to the substrate 100. The XY-plane is a plane parallel to the surface of the substrate 100 over which the silicon film 101 is formed. The X-direction is the longitudinal direction of the rectangular substrate 100, and the Y-direction is the lateral direction of the substrate 100. Further, in the laser irradiation apparatus 1, the silicon film 101 is irradiated with the laser light L1 while the substrate 100 is conveyed in the X-axis positive direction by a conveying mechanism (not shown in FIG. 1). Note that, in FIG. 1, the silicon film 101 that has not yet been irradiated with the laser light L1 is referred to as an amorphous silicon film 101a, and the silicon film 101 that has already been irradiated with the laser light L1 is referred to as a polysilicon film 101b.

The laser irradiation apparatus 1 includes a stage 10, a laser light source 21, an optical system 20 and a detection unit 22. The substrate 100 is disposed over the stage 10. The stage 10 is a flotation stage (a flotation unit) that floats (i.e., levitates) the substrate 100 by ejecting air. But the stage 10 is not limited to the flotation stage. For example, the stage 10 may be a vacuum chuck type stage. The stage 10 ejects gas toward the substrate 100 from below the substrate 100. Therefore, the substrate 100 is conveyed in the X-axis positive direction in a state in which a minute air gap is formed between the stage 10 and the substrate 100.

The optical system 20 is an optical system for irradiating the silicon film 101 with laser light L1 in order to crystallize the amorphous silicon film 101a. The optical system 20 includes a polarization control unit 30 for controlling the polarization state of the laser beam L1. The polarization control unit 30 controls the polarization state of the laser beam L1. The detailed configuration of the optical system 20 will be described later.

The optical system 20 is disposed above the substrate 100 (on the Z-axis positive side of the substrate 100). The laser light source 21 is a pulsed laser light source and generates pulsed laser light. The laser light source 21 is, for example, a solid-state laser apparatus such as a Nd: YAG laser apparatus. Further, the laser light source 21 emits pulsed laser light L1. The laser light source 21 emits linearly polarized laser light L1. The laser light source 21 is not limited to the solid-state laser apparatus, but may be a semiconductor laser apparatus.

The optical system 20 includes a homogenizer for uniformizing the laser beam L1, a condenser lens for condensing the laser beam L1, and the like. The laser light L1 forms a linear irradiation region over the substrate 100. The irradiation region has a line shape in which the Y direction is a longitudinal direction and the X direction is a lateral direction.

The optical system 20 guides the laser light L1 emitted from the laser light source 21 to the substrate 100. The laser light incident on the substrate 100 from the optical system 20 is referred to as a laser light L2. The amorphous silicon firm 101a is crystallized by the irradiation of the laser light L2. The silicon film 101 is irradiated with the laser light L2 while the part in the substrate 100 to which the laser light L2 is applied is changed. A uniform polysilicon film 101b is formed over the substrate 100 by conveying the substrate 100 in the X-axis positive direction by the conveying mechanism of the stage 10. Needless to say, the laser light source 21 and the optical system 20 may be moved instead of conveying the substrate 100. That is, any configuration or the like may be used as long as the irradiation region is scanned by the laser light L2 by moving the substrate 100 and the annealing optical system 20 relative to each other.

Further, the detection unit 22 is disposed over the substrate 100. The detection unit 22 is provided in order to photograph (i.e., take an image of) the crystallized polysilicon film 101b. The detection unit 22 includes a camera for photographing the polysilicon film 101b, for example. Alternatively, the detection unit 22 may include a spectrometer for measuring the spectrum of the reflected light reflected by the polysilicon film 101b. Furthermore, the detection unit 22 may include an illumination light source for illuminating the substrate 100. For example, the illumination light source generates illumination light for illuminating a region irradiated with the laser light L2. The camera detects the reflected light from the region illuminated by the illumination light. Since the detection unit 22 can photograph the region irradiated with the laser beam L2, the crystal state of the polysilicon film 101b can be evaluated. It becomes possible to evaluate uniformity and unevenness of the crystal state of the polysilicon film 101b.

Figure 2:
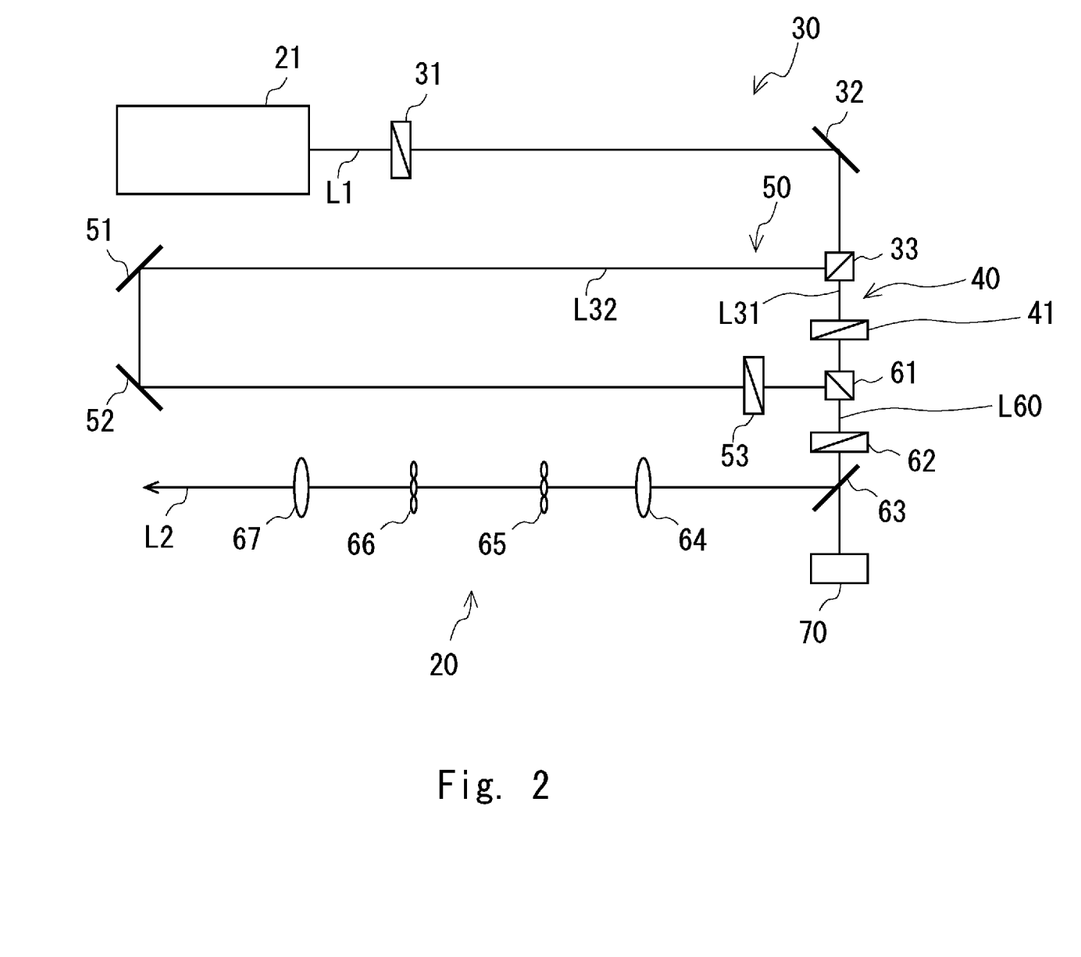
FIG. 2 shows an optical system of the laser annealing apparatus.

A polarization control unit 30 controls a polarization state of the laser beam L1 and adjusts a pulse waveform. Specifically, the polarization control unit 30 controls the time waveform of the pulse laser beam by delaying a part of the pulse laser beam. FIG. 2 is a diagram showing a configuration of the polarization control unit 30. The polarization control unit 30 includes a half-wave plate 31, a mirror 32, the polarization beam splitter 33, the polarization beam splitter 61, and a wave plate 62.

The half-wave plate 31 is rotatably provided in the optical path of the laser beam L1. The polarization direction of the laser beam L1 can be adjusted by rotating the half-wave plate 31 around the optical axis of the laser beam L1. That is, the linear polarization direction rotates according to the rotation angle of the half-wave plate 31.

The laser beam L1 is incident on the mirror 32 through the half-wave plate 31. The mirror 32 reflects the laser light L1 toward the polarization beam splitter 33. The laser beam L1 reflected by the mirror 32 is incident on the polarization beam splitter 33.

The polarization beam splitter 33 branches the laser beam L1 into two pulse beams L31 and L32. The polarization beam splitter 33 branches the incident light according to the polarization state. Specifically, the polarization beam splitter 33 transmits through the P polarization component and reflects the S polarization component. Therefore, the pulse light L31 transmitted through the polarization beam splitter 33 becomes linearly polarized light of P polarization. The pulse light L32 reflected by the polarization beam splitter 33 becomes linearly polarized light of S polarization.

The pulse light L31 and the pulse light L32 are combined by the polarization beam splitter 61 at a later stage. Two optical paths are provided between the polarization beam splitter 33 and the polarization beam splitter 61. The pulse light L31 propagates in one optical path from the polarization beam splitter 33 to the polarization beam splitter 61, and the pulse light L32 propagates in the other optical path from the polarization beam splitter 33 to the polarization beam splitter 61. An optical path length difference is given between the two optical paths so as to delay the pulse light L32 from the pulse light L31.

Between the polarization beam splitter 33 and the polarization beam splitter 61, an optical path through which the pulse light L31 propagates is referred to as a preceding optical path 40, and an optical path through which the pulse light L32 propagates is referred to as a delay optical path 50. The optical path length of the delay optical path 50 is longer than that of the preceding optical path 40. The pulse light L31 is defined as a preceding pulse light and the pulse light L32 is defined as a delay pulse light.

A wave plate 41 is arranged in the preceding optical path 40. The pulsed light L31 from the polarization beam splitter 33 passes through the wave plate 41, and then enters the polarization beam splitter 61.

A mirror 51, a mirror 52 and a wave plate 53 are arranged in the delay optical path 50. The pulse light L32 from the polarization beam splitter 33 is reflected by the mirror 51 and the mirror 52. The pulse light L32 reflected by the mirror 52 is incident on the wave plate 53. The pulse light L32 passes through the wave plate 53, and the enters the polarization beam splitter 61. Since the mirror 51 and the mirror 52 are arranged in the delay optical path 50, the optical path length becomes longer than that of the preceding optical path 40. Thus, the pulse light L32 entering the polarization beam splitter 61 is delayed more than the pulse light L31.

In FIG. 2, two mirrors 51 and 52 are provided in the delay optical path 50, but the arrangement and the number of mirrors 51 and 52 may be adjusted according to the optical path length difference. Of course, an optical element other than a mirror may be used to form the optical path length difference. The delay time may be adjusted by adjusting the positions of the mirrors 51 and 52.

The polarization beam splitter 61 combines the pulse light L31 with the pulse light L32. The polarization beam splitter 61 transmits the pulse light L31 and reflects the pulse light L32. Thus, the pulse light L31 and the pulse light L32 propagate in the same optical axis. In a state where the pulse light L32 is delayed from the pulse light L31 by the optical path length difference, the pulse light L31 and the pulse light L32 are combined with each other.

For example, each of the wave plate 41 and the wave plate 53 is a half-wave plate. The wave plate 41 may be a third half-wave plate and the wave plate 53 may be a fourth half-wave plate. In the preceding optical path 40, the wave plate 41 is rotatably arranged. The rotational axis of the wave plate 41 is parallel to the optical axis of the pulse light L31. In the delay optical path 50, the wave plate 53 is rotatably arranged. The rotational axis of the wave plate 53 is parallel to the optical axis of the pulse light L32.

The wave plates 41 and 53 are provided to reduce the loss of light at the polarization beam splitter 61. For example, the polarization beam splitter 61 transmits the P polarization component and reflects the S polarization component. The wave plate 41 is arranged to maximize the transmitted light amount of the pulse light L31 at the polarization beam splitter 61. That is, the wave plate 41 is arranged at a rotation angle such that the pulse light L31 incident on the polarization beam splitter 61 becomes P polarization.

The wave plate 53 is arranged to maximize the amount of reflected light of the pulse light L32 at the polarization beam splitter 61. That is, the wave plate 53 is arranged at a rotation angle such that the pulse light L32 incident on the polarization beam splitter 61 becomes S polarization. For example, reflection by the mirror 51 and the mirror 52 may cause the polarization direction of the pulse light L32 to rotate. Even in such a case, the loss of the pulse light L32 in the polarization beam splitter 61 can be prevented by rotating the wave plate 53. The wave plate 41 and the wave plate 53 may be omitted.

As described above, the polarization beam splitter 61 combines the pulse light L31 with the pulse light L32. Therefore, the preceding pulse light and the delayed pulse light propagate coaxially. Here, the pulse light L31 and the pulse light L32 combined by the polarization beam splitter 61 are used as a combined pulse light L60. The combined pulse light L60 includes the preceding pulse light and the delayed pulse light.

Figure 3:
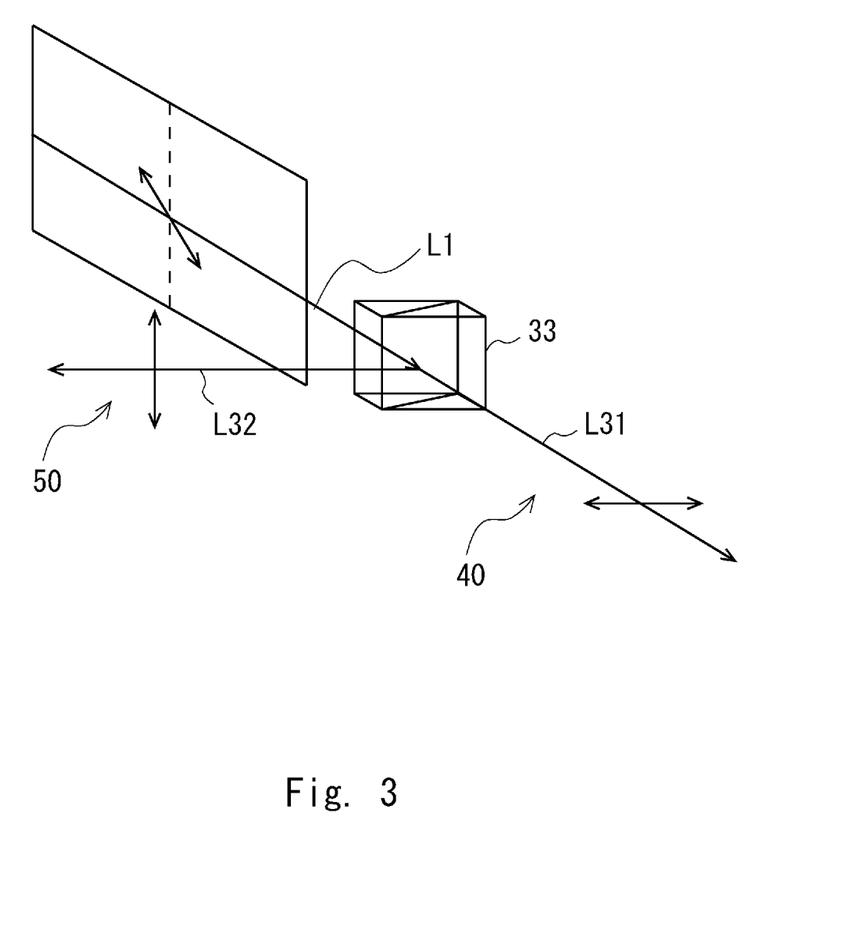
FIG. 3 shows a laser light split by a polarization beam splitter 33.

The light amount of the pulse light L31 and the pulse light L32 will now be described. As shown in FIG. 3, the pulse light L31 and the pulse light L32 are linearly polarized light orthogonal to each other. Here, the half-wave plate 31 is disposed in an optical path from the laser light source 21 to the polarization beam splitter 33. Accordingly, by rotating the half-wave plate 31, the ratio of the pulse light L31 to the pulse light L32 can be adjusted. By rotating the half-wave plate 31, the polarization direction of the laser beam L1 is changed.

Figure 4:
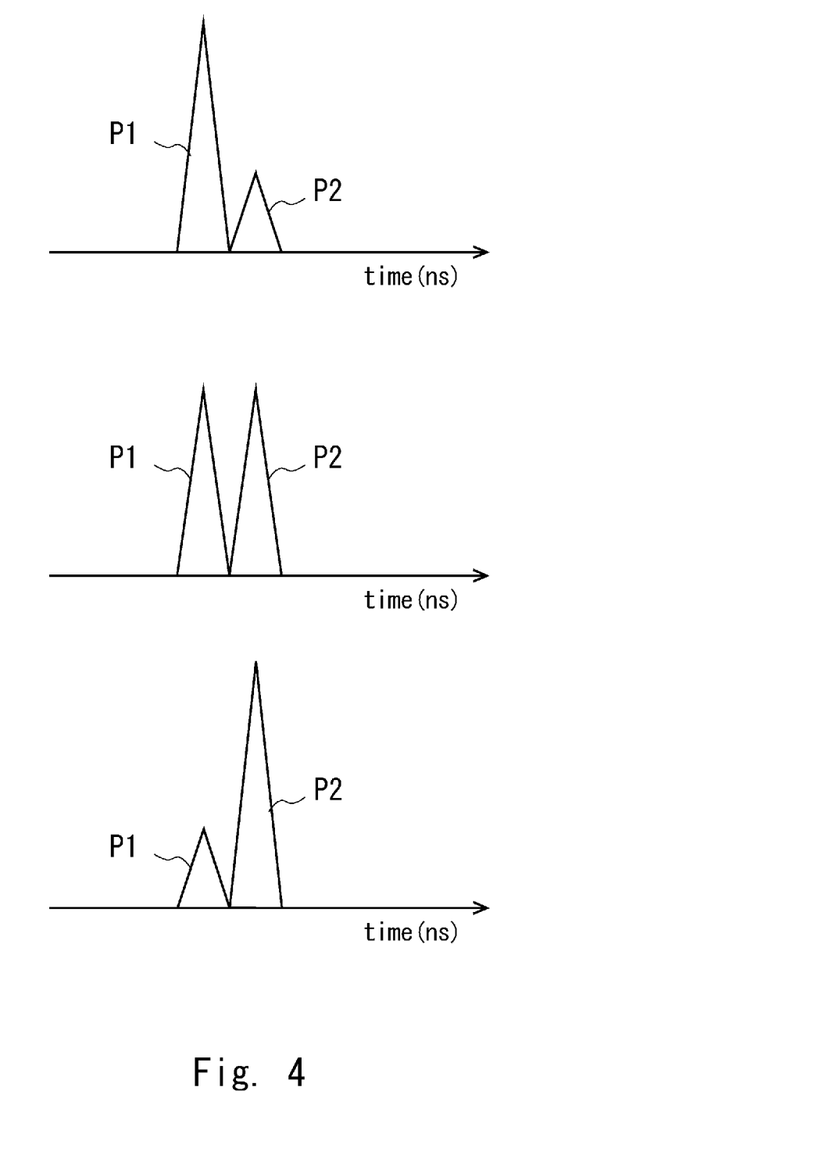
FIG. 4 shows time waveform of the laser light combined by a polarization beam splitter 61.

Therefore, the intensity ratio of the preceding pulse light to the delayed pulse light can be changed according to the rotation angle of the half-wave plate 31. FIG. 4 is a diagram schematically showing the time waveform of the combined pulse light L60 including the preceding pulse light P1 and the delay pulse light P2. In FIG. 4, three examples are shown when the angle of the half-wave plate 31 is changed.

The upper part of FIG. 4 shows a time waveform when the intensity of the preceding pulse light P1 is set to be higher than that of the delay pulse light P2. In the middle part of FIG. 4, a time waveform is shown when the intensity of the preceding pulse light P1 is equal to that of the delayed pulse light P2. The lower part of FIG. 4 shows a time waveform when the intensity of the preceding pulse light P1 is set lower than that of the delay pulse light P2. By changing the rotation angle of the half-wave plate 31, the intensity ratio of the preceding pulse light P1 and the delayed pulse light P2 can be made arbitrary. Therefore, the time waveform of the combined pulse light L60 can be adjusted. Since the attenuator does not dump the laser beam, the intensity of the laser beam can be maintained.

The embodiment will be described with reference to FIG. 2 again. The combined pulse light L60 from the polarization beam splitter 61 enters the wave plate 62. The wave plate 62 is a second half-wave plate. The wave plate 62 is rotatably provided in the optical path of the combined pulse light L60. By rotating the wave plate 62 around the optical axis of the combined pulse light L60, the polarization direction of the combined pulse light L60 can be adjusted. That is, the linear polarization direction rotates according to the rotation angle of the wave plate 62.

The combined pulse light L60 transmitted through the wave plate 62 is reflected by the mirror 63. The combined pulse light L60 reflected by the mirror 63 is made incident on the lens 64, the homogenizer 65, the homogenizer 66 and the lens 67 in this order.

The lens 64 condenses the combined pulse light L60. The homogenizer 65 and the homogenizer 66 uniformize the spatial distribution of the combined pulse light L60. The homogenizer 65 is a combination of an array lens for dividing the beam in the X direction and an array lens for dividing the beam in the Y direction. The homogenizer 66 is a combination of an array lens for transmitting a beam divided in the X direction to a condenser lens constituting the lens 67 and an array lens for transmitting a beam divided in the Y direction to the condenser lens constituting the lens 67. The condenser lens is installed so that the beam becomes a top flat beam at an aperture stage. Thereafter, the magnification is changed by the objective lens. The lens 67 condenses the combined pulse light L60.

Although not shown in Figs., the optical system 20 transmits beams in a manner such that the beam is repeatedly focused and collimated from the light source 11 to the homogenizer 65. The combined pulse light L60 may be enlarged so that the beam is divided immediately before the homogenizer 65. For example, the lens 64 may be a combination of a lens that magnifies the beam and a lens that collimates the magnified beam, specifically a telescoping lens. The lens 67 is a condenser lens for condensing a beam, and a slit (aperture) is arranged on a downstream side of the lens 67. An epi-illumination mirror for irradiating the substrate with the beam may be disposed downstream of the slit. An objective lens may be disposed downstream of the epi-illumination mirror.

The combined pulse light L60 is applied to substrate 100 as the laser light L2 of FIG. 1. The laser beam L2 forms a linear irradiation region on the substrate 100. The laser beam L2 is not limited to a line beam. For example, the laser beam L2 may have a top-flat spatial distribution in both the X direction and the Y direction. On the substrate 100, the spot shape of the laser beam L2 may be a 1-mm square. Thus, the substrate 100 can be irradiated with a line beam having a uniform spatial distribution.

Figure 5:
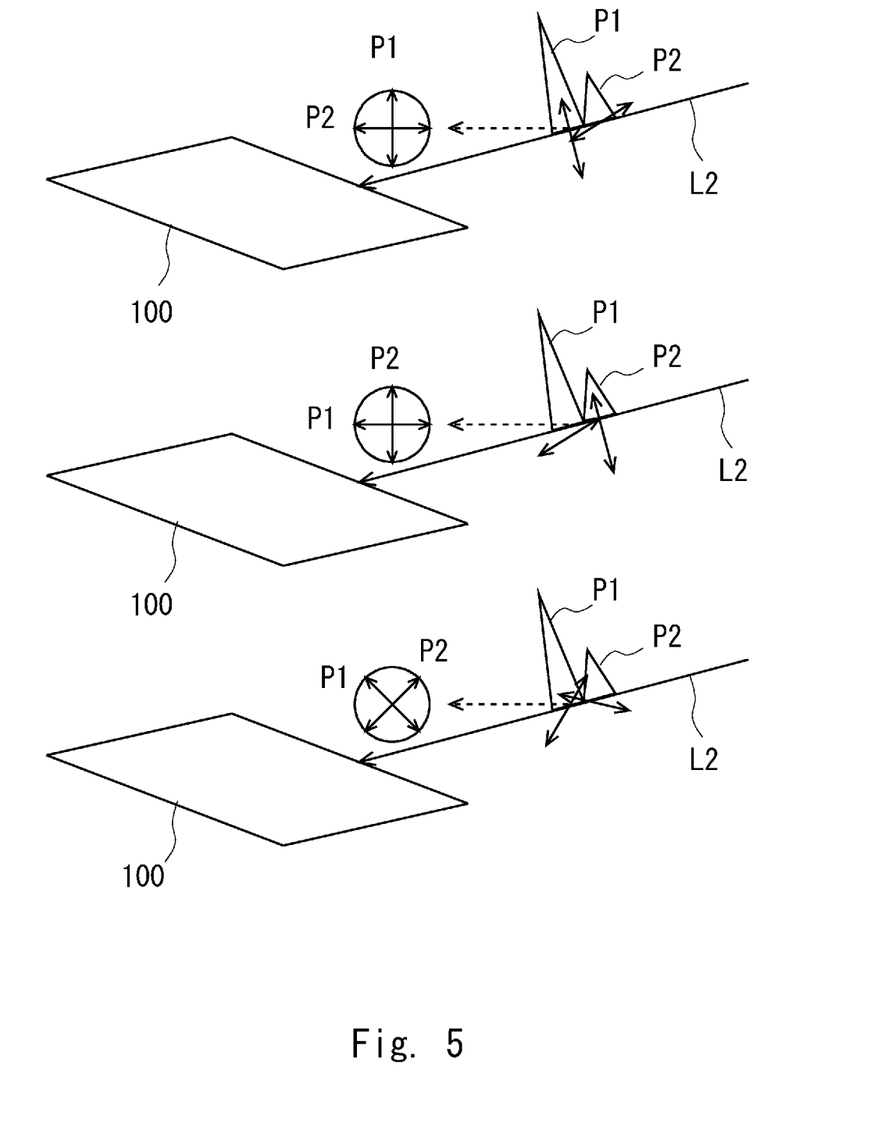
FIG. 5 illustrates the polarization state of the laser light synthesized by the polarization beam splitter 61.

With reference to FIG. 5, the polarization state of the laser beam L2 applied to the substrate 100 will be described. FIG. 5 is a diagram schematically showing a polarization state of a laser beam L2 including the preceding pulse beam P1 and the delay pulse beam P2. FIG. 5 shows three examples in which the angle of the wave plate 62 is changed.

As shown in FIG. 5, by changing the angle of the wave plate 62, with respect to the substrate 100, the preceding pulse light P1 can be made a first linear polarization light (for example, S polarization) and the delayed pulse light P2 can be made a second linear polarization light (for example, P polarization). Alternatively, by changing the angle of the wave plate 62, with respect to the substrate 100, the preceding pulse light P1 can be made the second linear polarization light and the delay pulse light P2 can be made the first linear polarization light. That is, the polarization states of the preceding pulse light P1 and the delay pulse light P2 can be exchanged. Further, the preceding pulse light P1 and the delay pulse light P2 can be a linear polarization light inclined by, for example, 45 degrees from the first linear polarization light. Of course, the rotation angle of the wave plate 62 is not limited to 45 degree.

Thus, by adjusting the rotation angle of the wave plate 62, a desired polarization state can be achieved. Therefore, the pulse laser beam in an appropriate polarization state can be applied to the substrate 100 according to the laser irradiation process. Further, according to the laser irradiation process, a pulse laser beam having an appropriate time waveform can be applied to the substrate 100.

Note that the mirror 63 may be a partial transmission mirror which transmits a part of the combined pulse light L60. For example, the mirror 63 reflects 99% of the combined pulse light L60 and transmits 1% of the combined pulse light L60. The combined pulse light L60 transmitted through the mirror 63 enters the photodetector 70. Of course, the transmittance and reflectance of the mirror 63 are not particularly limited. Further, when the detection by the photodetector 70 is not performed, the mirror 63 may have a reflectance of 100%.

The photodetector 70 detects combined pulse light L60 transmitted through the mirror 63. The rotation angle of the half-wave plate 31 may be adjusted according to the detection result by the photodetector 70. A photodetector 70 detects the time waveform of the combined pulse light L60. According to the detection result by the photodetector 70, the rotation angle of the half-wave plate 31 may be changed so that the light amounts of the preceding pulse light P1 and the delay pulse light P2 become a desired ratio.

The rotation angle of the wave plate 62 when the photodetector 70 detects the combined pulse light L60 will be described. The optical properties of mirror 63 may depend on the polarization state of the incident light. For example, it is assumed that the transmittance of the mirror 63 to the S polarization is lower than the transmittance of the mirror 63 to the P polarization. In this case, the ratio of the detected light amounts of the preceding pulse light P1 and the delayed pulse light P2 detected by the photodetector 70 deviates from the actual light amounts of the preceding pulse light P1 and the delayed pulse light P2. For example, when the preceding pulse light P1 is S polarization and the delayed pulse light P2 is P polarization, the photodetector 70 detects the combined pulse light L60 with the light amount ratio in which the light amount of the P polarized delayed pulse light P2 becomes high.

Therefore, in the present embodiment, the rotation angle of the wave plate 62 is adjusted so that the S polarization component and the P polarization component in the preceding pulse light P1 are equal to each other and the S polarization component and the P polarization component in the delay pulse light P2 are equal to each other. Specifically, the optic axis of the wave plate 62 is arranged to incline by 22.5 degree with respect to the linear polarization light of the preceding pulse light P1. Thus, when the preceding pulse light P1 passes through the wave plate 62, the linear polarization light of the preceding pulse light P1 is rotated by 45 degree.

The delayed pulse light P2 is linear polarization light orthogonal to the preceding pulse light P1. Therefore, when the delayed pulse light P2 passes through the wave plate 62, the linear polarization light of the delayed pulse light P2 is also rotated by 45 degree. Therefore, the polarization ratio of the preceding pulse light P1 incident on the mirror 63 can be made equal to the polarization ratio of the delayed pulse light P2. Therefore, the photodetector 70 can detect the combined pulse light L60 more accurately. Since the time waveform of the combined pulse light L60 can be accurately measured, the polarization state can be adjusted more appropriately. After the adjustment of the rotation angle of the half-wave plate 31 is completed, the rotation angle of the wave plate 62 may be adjusted.

Further, the rotation angle of the wave plate 41 or the wave plate 53 may be adjusted based on the detection result by the photodetector 70. The rotation angle of the wave plate 41 is changed so that the amount of light detected by the photodetector 70 becomes maximum. Thereafter, the rotation angle of the wave plate 53 is changed so that the amount of light detected by the photodetector 70 becomes maximum. Thus, the loss of the laser beam in the polarization beam splitter 61 can be reduced. After the adjustment of the rotation angles of the half-wave plate 31, the wave plate 41, and the wave plate 53 is completed, the wave plate 62 may be adjusted.

Further, the wave plate 62 may be a quarter-wave plate. For example, in a process of irradiating a circularly polarized laser beam with the substrate 100, the quarter wave plate can be used as the wave plate 62, instead of the half-wave plate.

The wave plate 41 and the wave plate 53 may be omitted. The wave plate 41 or the wave plate 53 may be a quarter-wave plate, respectively.

The polarization state may be controlled according to the evaluation result of the crystal state of the polysilicon film 101b. For example, the detection unit 22 shown in FIG. 1 detects the crystal state of the polysilicon film 101b. The rotation angles of the half-wave plate 31 and the wave plate 62 are adjusted according to the detection result of the detection unit 22. Thus, a polarization state suitable for various process conditions can be generated. For example, the polarization state can be optimized according to the output power of the laser beam, the type of substrate 100, the thickness of the silicon film 101, the conveying speed of the substrate 100, and the like. For example, the polarization state is controlled so that variation in the crystal state of the polysilicon becomes small. Therefore, the laser beam L2 in a polarization state suitable for the annealing process can be irradiated with the substrate 100.

By using the polarization beam splitter 33 and the polarization beam splitter 61, the loss of laser light can be reduced. The combined pulse light L60 in a desired polarization state can be efficiently generated. That is, since a polarizer or the like is not used, absorption of the laser beam can be prevented, and the laser beam can be efficiently utilized.

The laser annealing method according to the present embodiment comprises the steps of: (a) emitting a linearly polarized pulsed laser light; (b) causing the pulsed laser light to be made incident on a first half-wave plate rotatably placed; (c) branching the pulsed laser light from the first half-wave plate into a first pulsed light and a second pulsed light; (d) combining the first pulsed light with the second pulsed light, the second pulsed light being delayed from the first pulsed light by using an optical path length difference between the first pulsed light and second pulsed light; and (e) causing a combined pulsed laser to be made incident on a first wave plate rotatably provided in an optical path of the combined pulsed laser, the combine pulsed laser being generated by combining the first pulsed light with the second pulsed light at the second polarization beam splitter. By rotating the first half-wave plate and the first wave plate, a laser beam in an appropriate polarization state can be generated.

The polarization state of the laser beam affects the grain size and the orientation of the crystal.

In the present embodiment, the laser beam can be controlled to be in an arbitrary polarization state. Therefore, the polarization state can be controlled so as to improve the quality such as uniformity, periodicity, and orientation of the crystal. By controlling the micro crystal state, it is possible to perform an adjustment under conditions where unevenness hardly occurs.

Further, as the stage 10, it is preferable to use a flotation conveyance stage for conveying the substrate 100 while the substrate 100 is floated. In particular, the flotation conveyance stage is superior in transporting large substrates. When a large substrate is annealed, it is necessary to reduce the cost per unit product. When the large substrate is annealed using the flotation conveyance stage, the laser beam is converted into an appropriate polarization state and then irradiated with the substrate 100. Therefore, it is possible to perform appropriate annealing. Further, by controlling the polarization state based on the evaluation result of the crystal state by the detection unit 22, a high quality crystal can be produced with high productivity.

The polarization control unit 30 can be applied to the laser irradiation apparatus other than the laser annealing apparatus. For example, the polarization control unit 30 can be incorporated in the laser irradiation apparatus of a laser machining apparatus or a laser lift-off apparatus. The laser irradiation apparatus according to the present embodiment is not limited to the above-described example.

For example, in a laser machining process such as drilling, it may irradiate a circularly polarized laser beam with an object. In this case, a quarter-wave plate can be used as the wave plate 62. The laser light source 21 generates an ultrashort pulse of laser light L1, and the polarization controller 30 sets the combined pulse light L60 to a single pulse having a desired pulse width. In the laser lift-off device, the laser beam of an ultrashort pulse may be circularly polarized and irradiated with the object.

(Organic EL Display)

A semiconductor device having the above-described polysilicon film is suitable for a thin film transistor (TFT) array substrate used for an organic electro-luminescence (EL) display. That is, the polysilicon film is used as a semiconductor layer having a source region, a channel region, and a drain region of a TFT.

Figure 6:
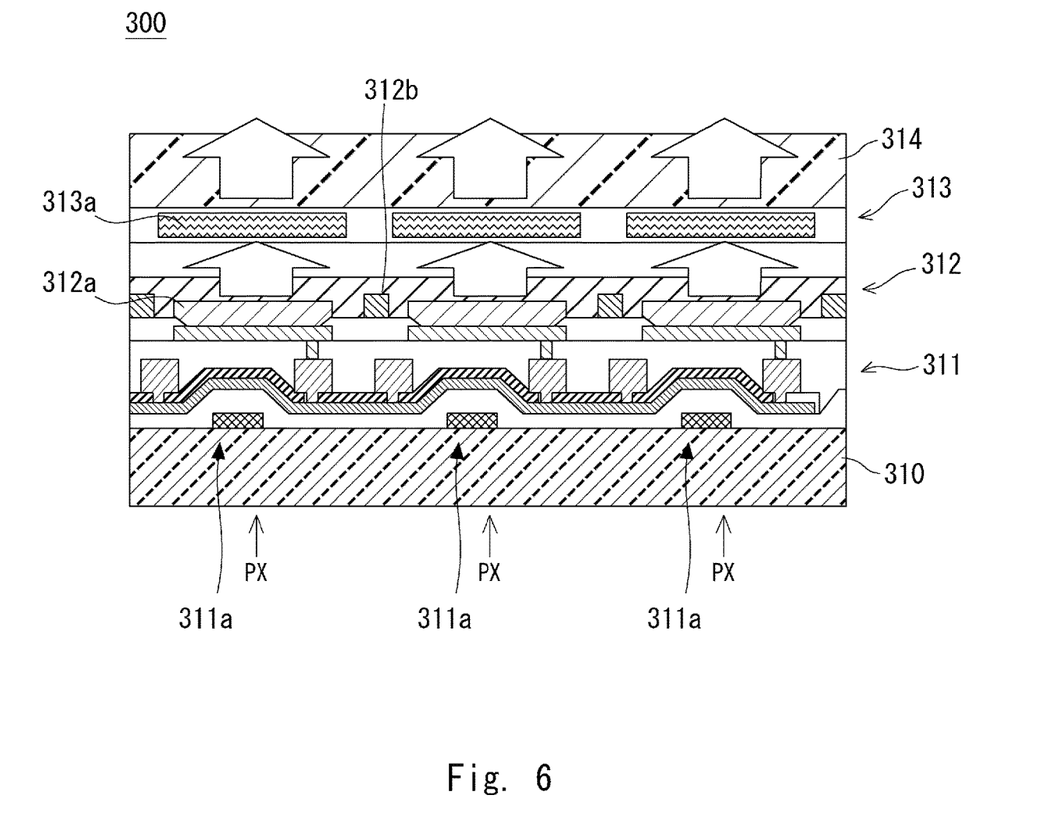
FIG. 6 is a simplified cross-sectional view of a configuration of an organic EL (Electro-Luminescent) display.

Hereinafter, a structure in which a semiconductor device according to the present embodiment is used for an organic EL display is described. FIG. 6 is a cross-sectional view of a pixel circuit of an organic EL display device illustrated in a simplified manner. The organic EL display device 300 shown in FIG. 6 is an active-matrix-type display device in which a TFT is disposed in each pixel PX.

The organic EL display device 300 includes a substrate 310, a TFT layer 311, an organic layer 312, a color filter layer 313, and a sealing substrate 314. FIG. 6 shows a top emission-type organic EL display device, in which the sealing substrate 314 side is located on the viewing side. Note that the following description is given to show an example of a configuration of an organic EL display device and this embodiment is not limited to the below-described configuration. For example, a semiconductor device according to this embodiment may be used for a bottom-emission-type organic EL display device.

The substrate 310 is a glass substrate or a metal substrate. The TFT layer 311 is provided over the substrate 310. The TFT layer 311 includes TFTs 311a disposed in the respective pixels PX. Further, the TFT layer 311 includes wiring lines (not shown) connected to the TFTs 311a, and the like. The TFTs 311a, the wiring lines, and the like constitute pixel circuits.

The organic layer 312 is provided over the TFT layer 311. The organic layer 312 includes an organic EL light-emitting element 312a disposed in each pixel PX. Further, in the organic layer 312, separation walls 312b for separating organic EL light-emitting elements 312a are provided between pixels PX.

The color filter layer 313 is provided over the organic layer 312. The color filter layer 313 includes color filters 313a for performing color displaying. That is, in each pixel PX, a resin layer colored in R (red), G (green), or B (blue) is provided as the color filter 313a.

The sealing substrate 314 is provided over the color filter layer 313. The sealing substrate 314 is a transparent substrate such as a glass substrate and is provided to prevent deterioration of the organic EL light-emitting elements of the organic layer 312.

Electric currents flowing through the organic EL light-emitting elements 312a of the organic layer 312 are changed by display signals supplied to the pixel circuits. Therefore, it is possible to control an amount of light emitted in each pixel PX by supplying a display signal corresponding to a display image to each pixel PX. As a result, it is possible to display a desired image.

In an active matrix display device such as an organic EL display, one pixel PX is provided with one or more TFTs (for example, a switching TFT and a driving TFT). Then, the TFT of each pixel PX is provided with a semiconductor layer having a source region, a channel region, and a drain region. The polysilicon film according to the present embodiment is suitable for a semiconductor layer of a TFT. That is, by using the polysilicon film manufactured by the above manufacturing method for a semiconductor layer of a TFT array substrate, it is possible to suppress in-plane ununiformity which is the TFT characteristics. Thus, it is possible to manufacture a display device having an excellent display characteristic with high productivity.

(Manufacturing Method for Semiconductor Device)

Figure 7:
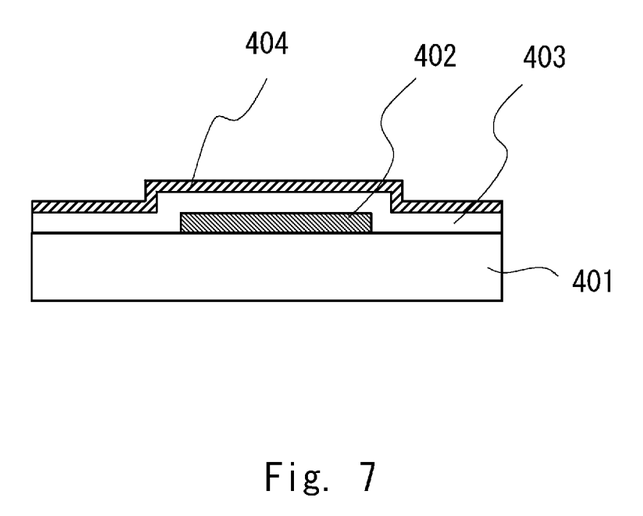
FIG. 7 is a cross-sectional view showing a process in a method for manufacturing a semiconductor device according to this embodiment.
Figure 8:
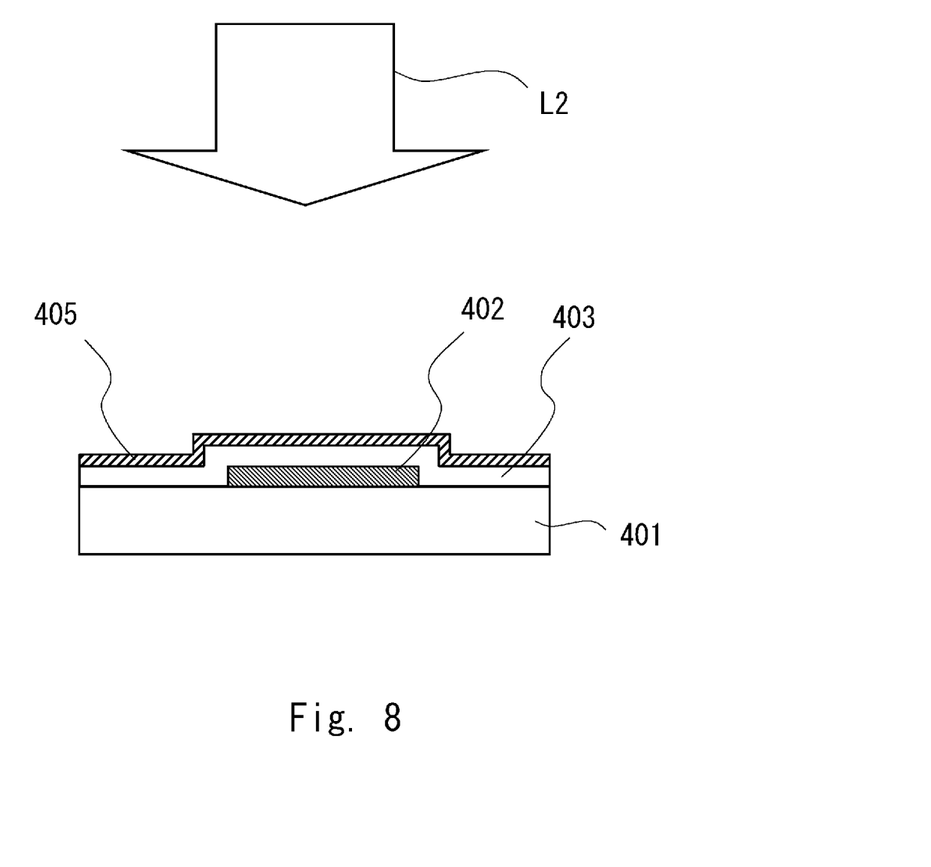
FIG. 8 is a cross-sectional view showing a process in a method for manufacturing a semiconductor device according to this embodiment.

A manufacturing method for a semiconductor device using the ELA apparatus according to the present embodiment is suitable for manufacturing a TFT array substrate. A method for manufacturing a semiconductor device including a TFT will be described with reference to FIGS. 7 and 8. FIGS. 7 and 8 are cross-sectional views showing processes for manufacturing a semiconductor device. In the following description, a manufacturing method for a semiconductor device having an inverted staggered TFT is described. FIGS. 7 and 8 shows steps for forming the polysilicon film in the manufacturing method for the semiconductor device. Note that well known methods can be used as manufacturing steps other than the polysilicon film formation, the explanations thereof are omitted.

As shown in FIG. 7, a gate electrode 402 is formed over a glass substrate 401. A gate insulating film 403402 is formed over the gate electrode 402. An amorphous silicon film 404 is formed over the gate insulating film 403. The amorphous silicon film 404 is arranged so as to overlap the gate electrode 402 interposing the gate insulating film 403. For example, the gate insulating film 403 and the amorphous silicon film 404 are continuously formed by a chemical vapor deposition (CVD) method.

Then, the amorphous silicon film 404 is irradiated with the laser light L2 and a polysilicon film 405 is thereby formed as shown in FIG. 8. That is, the amorphous silicon film 404 is crystallized by the ELA apparatus 1 shown in FIG. 1 and the like. The polysilicon film 405 with silicon crystallized is thereby formed on the gate insulating film 403. The polysilicon film 405 corresponds to the above polysilicon film 101*b*.

In addition, it has been described that the laser annealing apparatus according to the present embodiment irradiates an amorphous silicon film with laser light to form a polysilicon film in the above description, but the laser annealing apparatus may irradiate an amorphous silicon film with laser light to form a micro-crystal silicon film. Furthermore, a laser light for performing annealing is not limited to Nd:YAG laser. In addition, the method according to the present embodiment can be applied to a laser annealing apparatus that crystallizes thin films other than a silicon film. That is, as long as the laser annealing apparatus irradiates an amorphous film with laser light to form a crystallized film, the method according to the present embodiment can be applied. According to a laser annealing apparatus in accordance with the embodiment, it is possible to properly inspect a substrate with a crystallized film.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A laser irradiation apparatus comprising:
   a laser light source configured to emit a linearly polarized pulsed laser light;
   a first half-wave plate rotatably provided in an optical path of the pulsed laser light;
   a first polarization beam splitter configured to branch the pulsed laser light from the first half-wave plate into a first pulsed light and a second pulsed light;
   a second polarization beam splitter configured to combined the first pulsed light with the second pulsed light, the second pulsed light being delayed from the first pulsed light by using an optical path length difference between the first pulsed light and the second pulsed light; and
   a first wave plate rotatably provided in an optical path of a combined pulsed light generated by combining the first pulsed light with the second pulsed light at the second polarization beam splitter,
   wherein the first wave plate is a second half-wave plate, and
   wherein the laser irradiation apparatus further comprises:
   a partial transmission mirror configured to extract a part of the combined pulsed light transmitted through the second half-wave plate; and
   a photodetector configured to detect the combined pulsed light from the partial transmission mirror.

2. A laser irradiation apparatus comprising:
   a laser light source configured to emit a linearly polarized pulsed laser light;
   a first half-wave plate rotatably provided in an optical path of the pulsed laser light;
   a first polarization beam splitter configured to branch the pulsed laser light from the first half-wave plate into a first pulsed light and a second pulsed light;
   a second polarization beam splitter configured to combined the first pulsed light with the second pulsed light, the second pulsed light being delayed from the first pulsed light by using an optical path length difference between the first pulsed light and the second pulsed light;
   a first wave plate rotatably provided in an optical path of a combined pulsed light generated by combining the first pulsed light with the second pulsed light at the second polarization beam splitter; and
   a second wave plate rotatably provided in an optical path of a combined pulsed light from the first polarization beam splitter to the second polarization beam splitter.

3. The laser irradiation apparatus according to claim 2, wherein the second wave plate is a third half-wave plate.

4. A laser irradiation apparatus comprising:
   a laser light source configured to emit a linearly polarized pulsed laser light;
   a first half-wave plate rotatably provided in an optical path of the pulsed laser light;
   a first polarization beam splitter configured to branch the pulsed laser light from the first half-wave plate into a first pulsed light and a second pulsed light;
   a second polarization beam splitter configured to combined the first pulsed light with the second pulsed light, the second pulsed light being delayed from the first pulsed light by using an optical path length difference between the first pulsed light and the second pulsed light; and a first wave plate rotatably provided in an optical path of a combined pulsed light generated by combining the first pulsed light with the second pulsed light at the second polarization beam splitter, wherein the combined pulsed light forms a linear irradiation region along a first direction on an object.

5. The laser irradiation apparatus according to claim 4, wherein an amorphous film is formed over the object; and the film is crystalized by the combined pulsed light.

6. A laser irradiation method comprising the steps of:
(a) emitting a linearly polarized pulsed laser light;
(b) causing the pulsed laser light to be made incident on a first half-wave plate rotatably placed;
(c) branching the pulsed laser light from the first half-wave plate into a first pulsed light and a second pulsed light;
(d) combining the first pulsed light with the second pulsed light, the second pulsed light being delayed from the first pulsed light by using an optical path length difference between the first pulsed light and second pulsed light; and
(e) causing a combined pulsed laser to be made incident on a first wave plate rotatably provided in an optical path of the combined pulsed laser, the combine pulsed laser being generated by combining the first pulsed light with the second pulsed light at the second polarization beam splitter, wherein the first wave plate is a second half-wave plate, and wherein the laser irradiation method further comprises the steps of:
extracting a part of the combined pulsed light by causing the combined pulsed light from the second half-wave plate to be made incident on a partial transmission mirror, and
detecting the combined pulsed light from the partial transmission mirror by a photodetector.

7. A laser irradiation method comprising the steps of:
(a) emitting a linearly polarized pulsed laser light;
(b) causing the pulsed laser light to be made incident on a first half-wave plate rotatably placed;
(c) branching the pulsed laser light from the first half-wave plate into a first pulsed light and a second pulsed light;
(d) combining the first pulsed light with the second pulsed light, the second pulsed light being delayed from the first pulsed light by using an optical path length difference between the first pulsed light and second pulsed light;
(e) causing a combined pulsed laser to be made incident on a first wave plate rotatably provided in an optical path of the combined pulsed laser, the combine pulsed laser being generated by combining the first pulsed light with the second pulsed light at the second polarization beam splitter; and
causing the second pulsed light to be made incident on a second wave plate rotatably provided in an optical path of a combined pulsed light from the first polarization beam splitter to the second polarization beam splitter.

8. The laser irradiation method according to claim 7, wherein the second wave plate is a third half-wave plate.

9. A laser irradiation method comprising the steps of:
(a) emitting a linearly polarized pulsed laser light;
(b) causing the pulsed laser light to be made incident on a first half-wave plate rotatably placed;
(c) branching the pulsed laser light from the first half-wave plate into a first pulsed light and a second pulsed light;
(d) combining the first pulsed light with the second pulsed light, the second pulsed light being delayed from the first pulsed light by using an optical path length difference between the first pulsed light and second pulsed light; and
(e) causing a combined pulsed laser to be made incident on a first wave plate rotatably provided in an optical path of the combined pulsed laser, the combine pulsed laser being generated by combining the first pulsed light with the second pulsed light at the second polarization beam splitter, wherein the combined pulsed light forms a linear irradiation region along a first direction on an object.

10. The laser irradiation method according to claim 9, wherein an amorphous film is formed over the object; and the film is crystalized by the combined pulsed light.

11. A method for manufacturing a semiconductor device, comprising the steps of:
(S1) forming an amorphous film over a substrate; and
(S2) annealing the amorphous film so that the amorphous film is crystalized and a crystallized film is thereby formed, wherein the step of (S2) annealing comprises the steps of:
(A) emitting a linearly polarized pulsed laser light;
(B) causing the pulsed laser light to be made incident on a first half-wave plate rotatably placed;
(C) branching the pulsed laser light from the first half-wave plate into a first pulsed light and a second pulsed light;
(D) combining the first pulsed light with the second pulsed light, the second pulsed light being delayed from the first pulsed light by using an optical path length difference between the first pulsed light and second pulsed light; and
(E) causing a combined pulsed laser to be made incident on a first wave plate rotatably provided in an optical path of the combined pulsed laser, the combine pulsed laser being generated by combining the first pulsed light with the second pulsed light at the second polarization beam splitter, wherein the first wave plate is a second half-wave plate, and wherein the method further comprises the steps of:
extracting a part of the combined pulsed light by causing the combined pulsed light from the second half-wave plate to be made incident on a partial transmission mirror, and
detecting the combined pulsed light from the partial transmission mirror by a photodetector.

12. A method for manufacturing a semiconductor device, comprising the steps of:
(S1) forming an amorphous film over a substrate; and
(S2) annealing the amorphous film so that the amorphous film is crystalized and a crystallized film is thereby formed, wherein the step of (S2) annealing comprises the steps of:
(A) emitting a linearly polarized pulsed laser light;
(B) causing the pulsed laser light to be made incident on a first half-wave plate rotatably placed;
(C) branching the pulsed laser light from the first half-wave plate into a first pulsed light and a second pulsed light;
(D) combining the first pulsed light with the second pulsed light, the second pulsed light being delayed from the first pulsed light by using an optical path length difference between the first pulsed light and second pulsed light; and
(E) causing a combined pulsed laser to be made incident on a first wave plate rotatably provided in an optical path of the combined pulsed laser, the combine pulsed laser being generated by combining the first pulsed light with the second pulsed light at the second polarization beam splitter,
wherein the method further comprises the step of: causing the second pulsed light to be made incident on a second wave plate rotatably provided in an optical path of a combined pulsed light from the first polarization beam splitter to the second polarization beam splitter.

13. The method for manufacturing a semiconductor device according to claim 12, wherein the second wave plate is a third half-wave plate.

14. A method for manufacturing a semiconductor device, comprising the steps of:
(S1) forming an amorphous film over a substrate; and
(S2) annealing the amorphous film so that the amorphous film is crystalized and a crystallized film is thereby formed, wherein
the step of (S2) annealing comprises the steps of:
(A) emitting a linearly polarized pulsed laser light;
(B) causing the pulsed laser light to be made incident on a first half-wave plate rotatably placed;
(C) branching the pulsed laser light from the first half-wave plate into a first pulsed light and a second pulsed light;
(D) combining the first pulsed light with the second pulsed light, the second pulsed light being delayed from the first pulsed light by using an optical path length difference between the first pulsed light and second pulsed light; and
(E) causing a combined pulsed laser to be made incident on a first wave plate rotatably provided in an optical path of the combined pulsed laser, the combine pulsed laser being generated by combining the first pulsed light with the second pulsed light at the second polarization beam splitter,
wherein the combined pulsed light forms a linear irradiation region along a first direction on an object.

* * * * *